US007774078B2

(12) United States Patent
Booth et al.

(10) Patent No.: US 7,774,078 B2
(45) Date of Patent: Aug. 10, 2010

(54) METHOD AND APPARATUS FOR AUDIO DATA ANALYSIS IN AN AUDIO PLAYER

(75) Inventors: Ted Booth, San Diego, CA (US); Jason Clement, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 754 days.

(21) Appl. No.: 11/229,298

(22) Filed: Sep. 16, 2005

(65) Prior Publication Data

US 2007/0064954 A1 Mar. 22, 2007

(51) Int. Cl.
*G06F 17/00* (2006.01)
*H03G 5/00* (2006.01)
*A63H 5/00* (2006.01)
*G10H 7/00* (2006.01)

(52) U.S. Cl. .......................... 700/94; 381/103; 84/609; 84/616

(58) Field of Classification Search .................. 381/58, 381/101, 103; 455/233.1, 234.1, 267; 700/94; 84/609–613, 616
See application file for complete search history.

(56) References Cited

U.S. PATENT DOCUMENTS 5,450,312 A * 9/1995 Lee et al. .................... 381/103
5,530,924 A * 6/1996 Miller ........................ 381/101
5,745,583 A * 4/1998 Koizumi et al. ............. 381/103
6,341,166 B1 * 1/2002 Basel ......................... 381/103
7,022,905 B1 * 4/2006 Hinman et al. ................ 84/609
2002/0069050 A1 * 6/2002 Funaki ....................... 704/207
2003/0007001 A1 1/2003 Zimmerman
2003/0028385 A1 * 2/2003 Christodoulou ............. 704/278
2003/0086341 A1 5/2003 Wells et al.
2004/0237750 A1 12/2004 Smith et al.
2006/0046685 A1 * 3/2006 Hjelmeland ................. 455/355

FOREIGN PATENT DOCUMENTS

WO WO 03/023786 A2 * 3/2003

OTHER PUBLICATIONS

PCT International Search Report and Written Opinion of the International Searching Authority, PCT/US 06/33666, mail date: Jul. 23, 2007, pp.

* cited by examiner

*Primary Examiner*—Curtis Kuntz
*Assistant Examiner*—Jesse A Elbin
(74) *Attorney, Agent, or Firm*—Fitch, Even, Tabin & Flannery

(57) ABSTRACT

One embodiment can be characterized as a method of data analysis for an audio player comprising analyzing at least a portion of audio data; selecting a sound profile based upon the analysis of the audio data; adjusting sound field settings according to the sound profile; and outputting at least a portion of the audio data according to the sound field settings. Another embodiment can be characterized as an audio player device comprising an audio analysis circuit adapted to determine a characteristic of audio data; a profile selection circuit adapted to select a sound profile corresponding to the characteristic of audio data; and a sound field circuit adapted to adjust sound field settings according to the sound profile.

32 Claims, 3 Drawing Sheets

METHOD AND APPARATUS FOR AUDIO DATA ANALYSIS IN AN AUDIO PLAYER

BACKGROUND OF THE INVENTION

1. Field of the Invention

The present invention relates to audio players. More specifically, the present invention relates to an audio player adapted to analyze audio data and adjust output according to the analysis.

2. Discussion of the Related Art

Most music players provide the capability to manually adjust the sound settings (for example, equalizer settings) that affect music playback. Many users will almost never change the sound settings because of a lack of convenience in the manner in which to adjust the sound settings. Additionally, once set, the listener rarely will re-program the sound settings as long as a similar type of music is being played back. Music players are, however, increasingly supporting the random playback of music, through functionality including, for example, song or track shuffle playback, play lists, music streaming and user-defined radio stations. This provides for much more frequent playback of dissimilar types of music during the time when a user is listening to music. This requires the user to re-program the sound settings more frequently in order to properly fit the type of music being played. For many listeners, frequently adjusting the sound settings can become annoying and degrades the overall music listening experience. Other listeners will simply stop adjusting the sound settings which also degrades the overall music listening experience.

SUMMARY OF THE INVENTION

The present invention generally relates to an audio player adapted to analyze audio data and adjust output according to the analysis.

One embodiment can be characterized as a method of data analysis for an audio player comprising analyzing at least a portion of audio data; selecting a sound profile based upon the analysis of the audio data; adjusting a sound field setting according to the sound profile; and outputting at least a portion of the audio data according to the sound field setting. In a further embodiment, the step of analyzing at least a portion of audio data further comprises analyzing metadata. In yet another embodiment, the step of analyzing at least a portion of audio data further comprises analyzing sound content.

Another embodiment can be characterized as a method of data analysis for an audio player comprising recording user interaction with an audio player, the interaction corresponding to at least a portion of audio data; selecting a sound profile based upon the user interaction; adjusting a sound field setting according to the sound profile; and outputting at least a portion of the audio data according to the sound field setting. In some embodiments, the user interaction comprises listening to an audio track, adjusting the sound field setting or programming the sound profile by answering prompted questions.

A subsequent embodiment includes an audio player device comprising an audio analysis circuit adapted to determine a characteristic of audio data; a profile selection circuit adapted to select a sound profile corresponding to the characteristic of audio data; and a sound field circuit adapted to adjust sound field setting according to the sound profile.

BRIEF DESCRIPTION OF THE DRAWINGS

The above and other aspects, features and advantages of the present invention will be more apparent from the following more particular description thereof, presented in conjunction with the following drawings, wherein.

Figure 1:
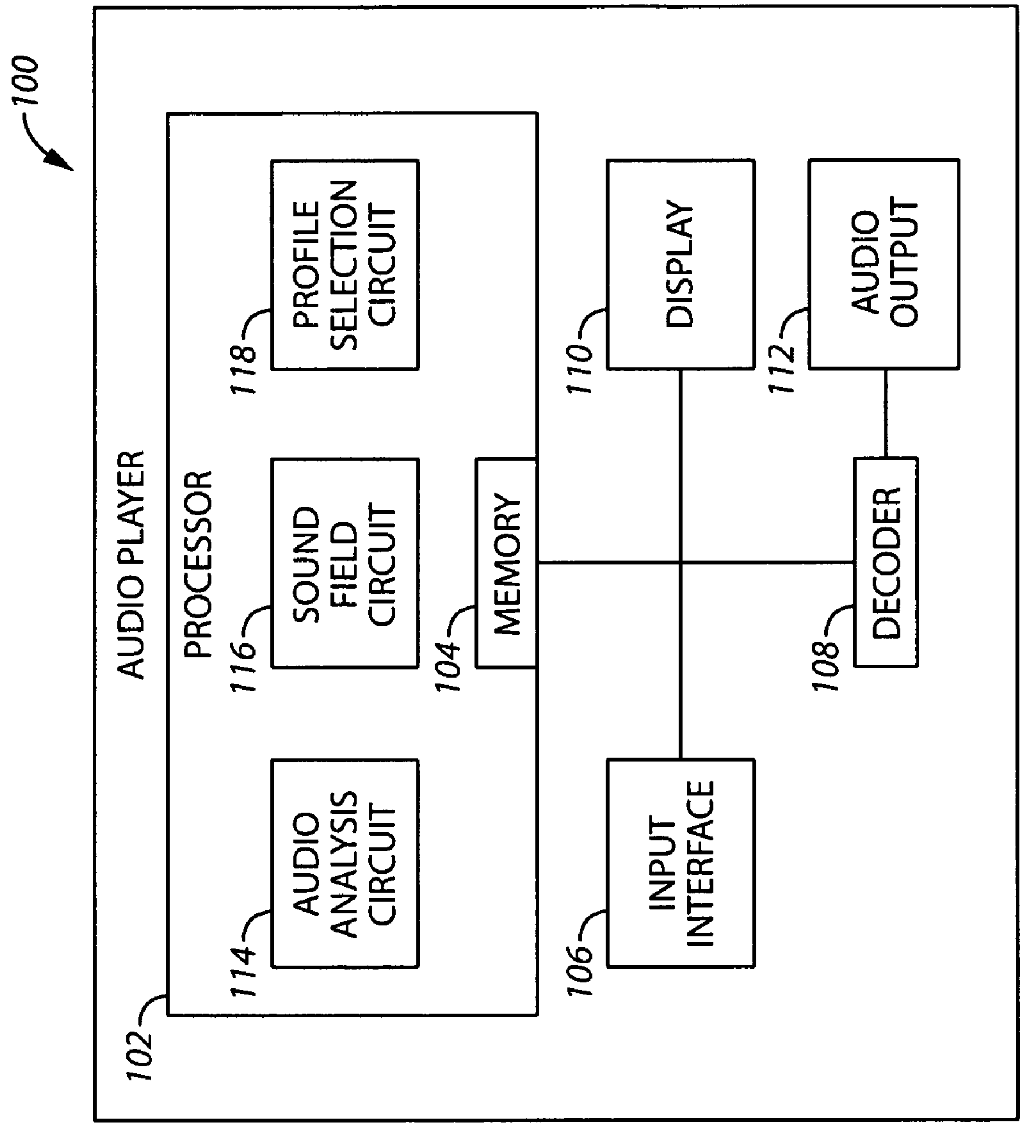
FIG. 1 is a block diagram illustrating an audio player in accordance with one embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions, sizing, and/or relative placement of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will also be understood that the terms and expressions used herein have the ordinary meaning as is usually accorded to such terms and expressions by those skilled in the corresponding respective areas of inquiry and study except where other specific meanings have otherwise been set forth herein.

DETAILED DESCRIPTION

The following description is not to be taken in a limiting sense, but is made merely for the purpose of describing the general principles of the invention. The scope of the invention should be determined with reference to the claims. The present embodiments address the problems described in the background while also addressing other additional problems as will be seen from the following detailed description.

Referring to FIG. 1, shown is a block diagram illustrating an audio player 100 in accordance with one embodiment. The audio player 100 includes a processor 102 with memory 104, an input interface 106, a decoder 108, a display 110 and an audio output 112. The processor 102 includes an audio analysis circuit 114, a sound field circuit 116 and a profile selection circuit 118.

The audio player 100 can be one of many manufactured and sold audio players widely available, including for example, an MP3 player, a CD player, a DVD audio player, a computer, or other type of audio player. As will be described herein, the audio player 100 is an electronic device that is capable, through a combination of hardware, firmware and/or software, of receiving, analyzing and outputting audio data.

The processor 102 has memory 104 and is operably coupled to the input interface 106, the decoder 108 and the display 110. The audio player 100 stores audio files in the memory 104 in the form of audio data. The processor 102 controls reading the audio data into or out of the memory 104. The decoder 108 decodes the audio data and outputs the decoded audio data to the audio output 112. The audio output 112 outputs the audio data as an audible signal that is heard by the user of the audio player 100. The audio output 112 is, for example, a speaker or an audio jack for use with a headphone set.

The memory 104 includes memory for storage of audio files. The memory 104 is, for example, a built-in hard disk drive, non-volatile "flash" memory, removable memory, such as a compact disk (CD), digital versatile disk (DVD), or any combination thereof. All or a portion of the memory may be in the form of one or more removable blocks, modules, or chips. The memory 104 need not be one physical memory device, but can include one or more separate memory devices.

The input interface 106 includes, for example, a keypad, a touchpad, a touch screen, a mouse, or other types of devices used to interact with an electronic device. During playback, the user may interact with the input interface 106 of the audio player 100 to adjust the sound field in a variety of ways. A sound field is defined by the physical characteristics of sound waves in a region of space. In the present application the sound field relating to an audio player is the sound that is emitted from an audio player. The sound field may be adjusted when a user interacts with the input interface 106 of the audio player 100 to adjust settings of the audio player 100, for example, equalizer settings, mode settings (for example, concert hall mode or surround sound mode), bass, treble, or other settings that affect the sound field. A particular arrangement of the various settings (equalizer and mode, for example), in aggregate, will result in a complete sound field setup. Throughout this application, therefore, sound field setting(s) will be used to describe a particular arrangement of one or more of the settings of the audio player 100 that affect the sound field. In some embodiments, the input interface 106 is adapted to record user interactions to be stored in the memory 104. User interactions include, by way of example only, playing an audio track at a particular sound field setting, adjusting the sound field setting while listening to a track, programming sound field settings to correspond with a particular track or genre of track, or responding to prompted questions regarding sound field settings in relation to a particular track or genre of track.

The display 110 visually presents images corresponding to, for example, metadata, sound field settings, or other information pertinent to a user's interaction with and/or use of the audio player 100. The metadata includes, for example, the name of the song, the artist, the album title, the genre and the time period from when the song was created. In some embodiments, the display 110 may present questions for the user to respond to regarding sound field settings in relation to a particular track or genre of track.

The processor 102 includes the audio analysis circuit 114, the sound field circuit 116 and the profile selection circuit 118. The audio analysis circuit 114, the sound field circuit 116 and the profile selection circuit 118 represent functional circuitry within the audio player 100. The audio analysis circuit 114, the sound field circuit 116 and the profile selection circuit 118 are implemented, in some embodiments, as software stored in the memory 104 and executed by the processor 102. As described herein, those skilled in the art will appreciate that circuit(s) can refer to dedicated fixed-purpose circuits and/or partially or wholly programmable platforms of various types and that these teachings are compatible with any such mode of deployment for the audio analysis circuit 114, the sound field circuit 116 and the profile selection circuit 118. The audio analysis circuit 114, sound field circuit 116 and profile selection circuit 118 are any type of executable instructions that can be implemented as, for example, hardware, firmware and/or software, or any combination thereof, which are all within the scope of the various teachings described.

The audio analysis circuit 114 determines a characteristic of audio data. The audio analysis circuit can determine one or more characteristics of the audio data in a varying number of ways. In one embodiment, the audio data includes both sound data (also referred to herein as sound content) and metadata. The audio data is stored in, for example, the memory 104. Alternatively, the audio data is streaming audio data received over a network connection (not shown) or stored in a remote memory device. The sound data is, for example, a song, a voice recording, or other similar type of recording. The metadata is data that is associated with the sound data and can be used to provide information about the sound data. For example, a song may have metadata such as artist, album, title, length, and genre, to name a few possibilities. The audio analysis circuit can analyze the metadata to determine a characteristic of the audio data. In another embodiment, the audio analysis circuit analyzes the sound data portion of the audio data in order to determine a characteristic of the audio data. The sound data is made up of wave forms that can be analyzed by the processor. The wave form is stored, for example, as a wave file in memory. The wave file is analyzed, for example, using twelve tone analysis (from the low tones to the high tones). The twelve tone analysis provides information about the key of the music, the chord progression, beat, structure and rhythm of the music. This information can be used to infer the characteristics of the sound data. Some of the features or characteristics of the sound data that can be extracted are tempo (e.g., beats per minute), speed (depends on tempo and rhythm), dispersion (variance in tempo), major or minor, type of chord, notes per unit of time, and rhythm ratio. By extracting different characteristics of the music, the characteristics can then be used by the profile selection circuit 118.

The profile selection circuit 118 selects the sound profile corresponding to the characteristic of audio data. As described above, in one embodiment, the audio data includes both sound data and metadata. The metadata includes, for example, genre data such as jazz, classical, rock, hip-hop, and metal. In some embodiments, the profile selection circuit 118 may select a sound profile that best fits the genre that was determined by the audio analysis circuit by analyzing the metadata of the audio data. In some embodiments, the profile selection circuit 118 may select a sound profile that best fits the characteristic of audio data that was determined by the audio analysis circuit by analyzing the sound data of the audio data. In some embodiments, the profile selection circuit 118 may select a sound profile based on prior user interaction with the audio player 100. As will be described below, the sound profile is used by the sound field circuit 116 to adjust sound field settings. In this manner, the sound profile selection circuit 118 is able to select a sound profile that will lead to automatic adjustments of the sound field settings such that the sound data (e.g., a song) is played back with, for example, equalizer settings, mode settings (for example, concert hall mode or surround sound mode), bass and treble that best match the song. The profile selection circuit 118 may be enabled to select sound field settings based upon factory set default settings, user defined preferences, preferences of a user that have been determined from previous user interactions with the audio player 100, or user interactions corresponding to a series of prompted questions the user responds to regarding sound field settings.

The sound field circuit 116 adjusts sound field settings according to the sound profile. The sound profile is, for example, a file that is a collaboration of values for the sound field settings. That is, the sound profile is used by the sound field circuit 116 in order to properly set values of the different sound field settings. For example, sound profiles can exist that are for a particular genre of music, for a particular person, and even for a particular audio track.

Figure 2:
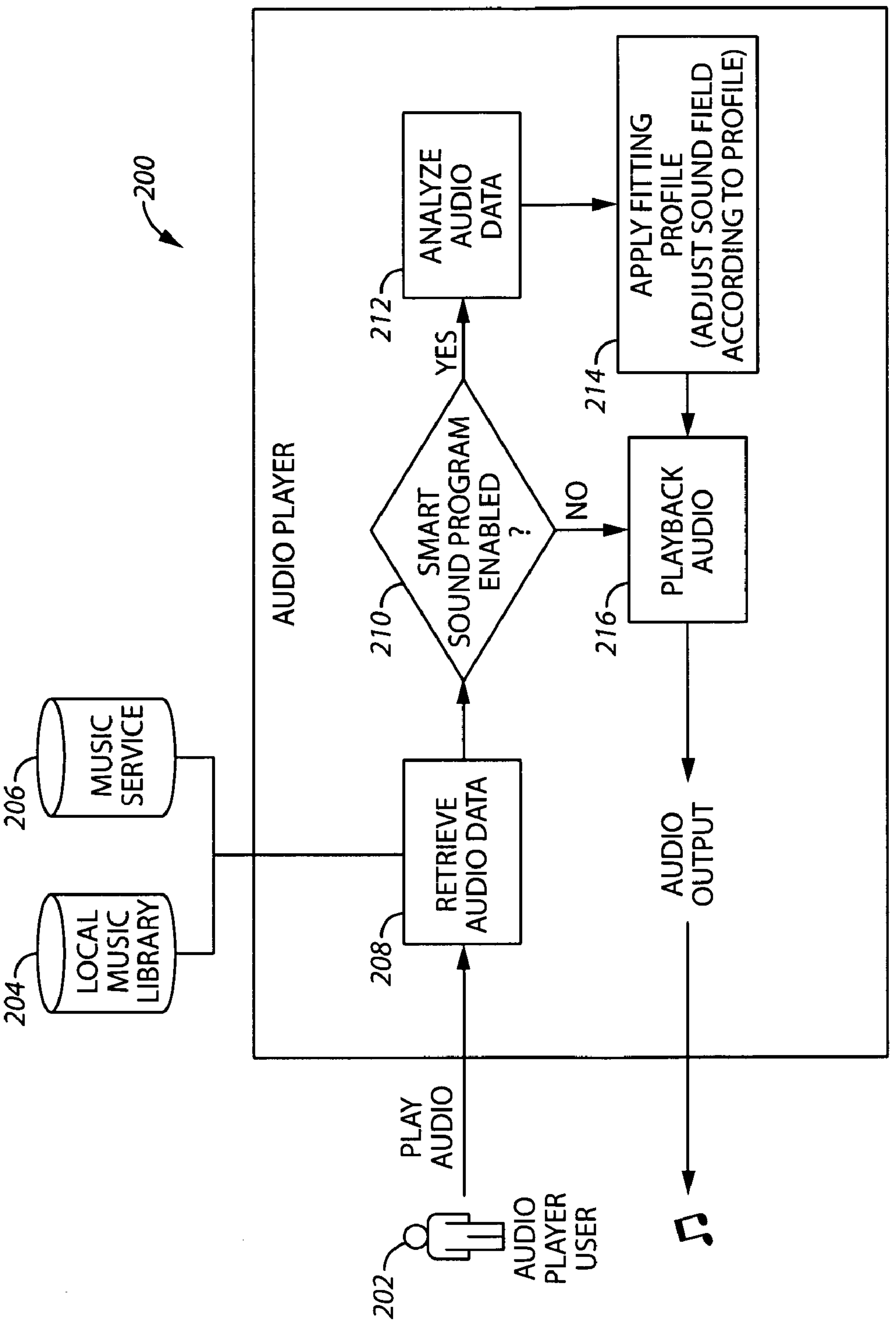
FIG. 2 is a flow diagram illustrating a method of analyzing audio data in accordance with one embodiment.

Referring to FIG. 2, shown is a flow diagram illustrating a method of analyzing audio data on an audio player in accordance with one embodiment. The following steps can be implemented, for example, within circuitry of the audio player 200.

Figure 3:
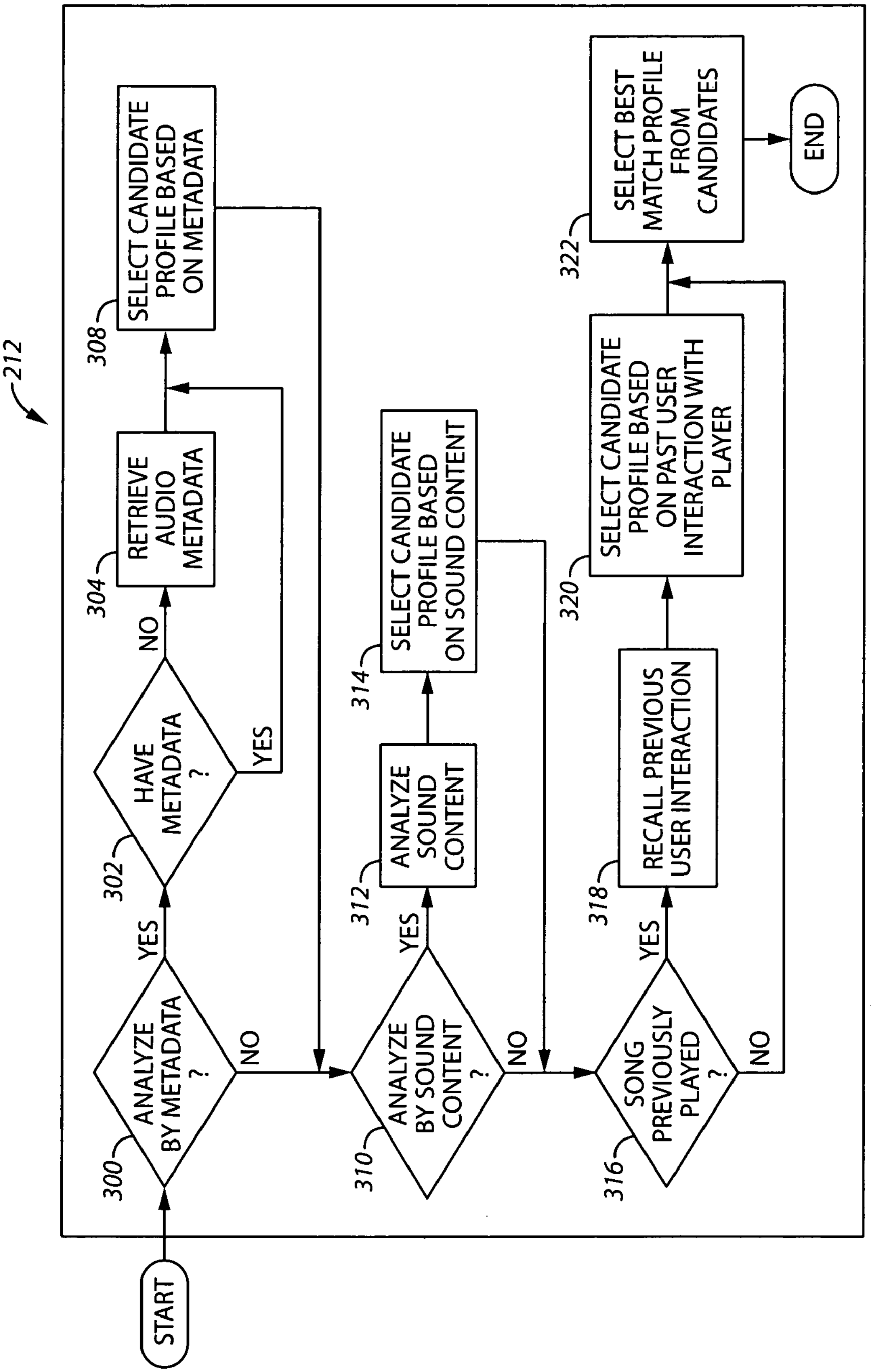
FIG. 3 is a flow diagram illustrating in more detail the analysis of audio data as shown in the flow diagram of FIG. 2.

As shown, when a user 202 decides to play an audio file using the audio player (e.g., a portable audio player, a car stereo or a home stereo), in step 208, the audio player retrieves the audio data. The audio data can be retrieved from, for example, a local music library 204, a music service 206, a local memory device of the audio player (e.g., a hard drive), or a portable memory device (e.g., a compact disk or DVD audio disk). Additionally, the audio data can be retrieved when a users selects a song to play from the audio player or the audio player can retrieve the song prior to when the song is going to be played by the audio player. In step 210, the audio player 200 determines if a smart sound program is enabled. If the smart sound program is disabled, the audio player plays back the audio data in step 216 and sound is output through an audio output (e.g., a speaker). If the smart sound program is enabled, the audio data that was retrieved by the audio player 200 is analyzed by the audio player in step 212. FIG. 3, discussed below, provides a detailed description of how the audio data is analyzed by the audio player. As will be discussed below, a sound profile is selected as part of the analysis of the audio data file in step 212. Next, in step 214, the audio player 200 adjusts sound field settings of the audio player 200 in accordance with the information contained in the sound profile that was selected in step 212. Following, in step 216, the audio data is output from the audio player with the adjusted sound field settings. As described above, by adjusting one or more of the various sound field settings, an improved listening experience can be obtained by the user 202 of the audio payer 200.

Referring to FIG. 3, a flow diagram is shown illustrating in more detail the analysis of audio data (step 212) as shown in the flow diagram of FIG. 2.

The process begins in step 300 when the audio player determines if the audio data that was retrieved will be analyzed by looking at the metadata of the audio data. If not, the process continues at step 310. If it has been determined that the audio data should be analyzed by looking at the metadata, then the audio player, in step 302, determines whether the metadata is currently available. If the metadata is available, the process continues at step 308. If the metadata is not available, the audio player attempts to retrieve the metadata at step 304. The metadata can be retrieved from, for example, a remote database, a web service or a local database. Next in step 308, one or more sound profiles are selected by the audio player based upon analysis of the metadata (e.g., determining a genre of the audio data). The selection can be based upon default settings, user defined preferences, or preferences of a user that have been determined from previous user interaction with the audio player.

Next, in step 310, the audio player determines if the audio data should be analyzed by determining a characteristic of the sound data. If not, the process continues at step 316. If the audio player is going to analyze the audio data, the sound content (e.g., the wave forms or wave file of the audio content) is analyzed by the audio player in step 312. As described above, the sound data is made up of wave forms that can be analyzed by the processor of the audio player using twelve tone analysis (from the low tones to the high tones). The twelve tone analysis provides information about the key of the music, the chord progression, beat, structure and rhythm of the music which can be used to determine the characteristics of the sound data such as tempo (e.g., beats per minute), speed (depends on tempo and rhythm), dispersion (variance in tempo), major or minor, type of chord, notes per unit of time, and rhythm ratio. By extracting different characteristics of the music, the characteristics can then be used to select one or more sound profiles in step 314. The selection can be based upon, for example, default settings, user defined preferences, or preferences of a user that have been determined from previous user interaction with the audio player.

Next, in step 316, the audio player determines if the audio data has been previously played by the audio player and if the audio player is going to select a sound profile based upon user interactions. If not, the process continues at step 322. If the audio data has been previously played by the audio player and if the audio player is to select a sound profile based upon user interactions, then the audio player recalls previous user interactions at step 318 during the playback of the audio file. The previous user interactions may be, for example, previously listening to audio data at particular sound field settings or adjusting the sound field settings during a previous playback of the audio data. In some embodiments, user interaction can be a response to one or a series of prompted questions displayed to the user 202 which the user responds to by interacting with the audio player 200. Next, in step 320, the audio player selects one or more sound profiles based upon the user interactions with the audio player 200.

Finally, in step 322, the audio player selects the best matched sound profile with which to play back the audio data. Depending upon the settings for the audio player and the flow followed in FIG. 3, the audio player may select between zero or more sound profiles. Having zero sound profiles to select from, for example, corresponds to no adjustments being made to the sound field settings. Having one sound profile to select from, for example, corresponds to adjusting the sound field settings according to the one sound profile. Having two sound profiles, for example, corresponds to the audio player selecting a sound profile from two of the three candidate profiles resulting from steps 308, 314, and 320. Having three sound profiles, for example, corresponds to the audio player selecting a sound profile from each of the three candidate profiles resulting from steps 308, 314, and 320. When there are a plurality of sound profiles, the audio player will select one sound profile and adjust the sound field accordingly. The audio player may select the one sound profile based upon factory settings or upon user interaction. For example, the factory settings may establish a hierarchy of sound profile candidates such that a candidate profile based upon past user interaction with the player (step 320) trumps a candidate profile based upon metadata (step 308) which trumps a candidate profile based upon sound content (step 314).

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

We claim:

1. A method of data analysis by way of an audio player device, comprising:

providing an audio player device, the audio player device providing step comprising:

providing an input interface;

providing a display operatively coupled with the input interface;

providing a decoder operatively coupled with the input interface and the display;

providing an audio output operatively coupled with the decoder;

providing a memory;

providing a smart sound program;

providing an audio analysis circuit operatively coupled with the memory and adapted to determine at least one characterizable element relating to at least one of at least one portion of audio data stored in the memory, the audio analysis circuit being adapted to analyze the at least one portion of audio data using a twelve-tone analysis by way of the smart sound program, the twelve-tone analysis providing information comprising at least one feature selected from a group consisting essentially of a key, a chord, a chord progression, a beat, a structure, and a rhythm, and the information providing extractable data comprising a tempo and a dispersion;

providing a profile selection circuit operatively coupled with the memory and adapted to select a sound profile corresponding to the at least one characterizable element of the at least one portion of audio data stored in the memory and based on previous user interaction, the profile selection circuit using the extractable data; and providing a sound field circuit operatively coupled with the memory and adapted to automatically adjust a sound field setting according to the sound profile, whereby an adjusted sound field setting is provided, wherein the sound field setting comprises at least one parameter selected from a group consisting essentially of an equalizer setting, a mode setting, a treble setting, a bass setting, the mode setting indicating a sound forum type, and wherein a sound field setup comprises an aggregate of the at least one sound field setting parameter, and wherein the audio analysis circuit, the sound field circuit, and the profile selection circuit each comprise at least one element selected from a group consisting essentially of hardware, firmware, and software for implementing a set of executable instructions, analyzing at least one portion of audio data using the twelve-tone analysis by the audio analysis circuit, the twelve-tone analysis comprising processing the at least one portion of the audio data from a low tone to a high tone, wherein the step of analyzing at least a portion of audio data further comprises analyzing metadata, the metadata comprising a time period and at least one characteristic selected from a group consisting essentially of an artist name, an album, a title, a length, and a genre;

selecting a sound profile based upon the analysis of the audio data by the profile selection circuit;

providing a sound field setting by the sound field circuit;

automatically adjusting the sound field setting according to the sound profile by the sound field circuit, thereby providing an adjusted sound field setting; and outputting at least a portion of the audio data according to the adjusted sound field setting by the audio output.

2. The method of claim 1, wherein the step of providing an audio analysis circuit comprises further providing the extractable data with a feature selected from a group consisting essentially of a speed, a key type, a chord type, a number of notes per unit time, and a rhythm ratio.

3. The method of claim 1 wherein the step of analyzing at least a portion of audio data further comprises analyzing sound content.

4. The method of claim 1 wherein the step of selecting a sound profile based upon the analysis of the audio data further comprises selecting from factory set sound profiles.

5. The method of claim 1 wherein the step of selecting a sound profile based upon the analysis of the audio data further comprises selecting from user created sound profiles.

6. The method of claim 1 wherein the step of selecting a sound profile based upon the analysis of the audio data further comprises selecting a sound profile based on an analysis of metadata.

7. The method of claim 1 wherein the step of selecting a sound profile based upon the analysis of the audio data further comprises selecting a sound profile based on an analysis of sound content.

8. The method of claim 1 wherein the step of selecting a sound profile based upon the analysis of the audio data further comprises:

selecting a candidate profile based on an analysis of metadata;

selecting a candidate profile based on an analysis of sound content; and selecting a best match profile from the group consisting of the candidate profile based on an analysis of metadata and the candidate profile based on an analysis of sound content.

9. The method of claim 1 wherein the step of selecting a sound profile based upon the analysis of the audio data further comprises:

selecting a candidate profile based on an analysis of metadata;

selecting a candidate profile based on an analysis of sound content;

selecting a candidate profile based on a user interaction with an audio player, the interaction corresponding to at least a portion of audio data; and selecting a best match profile from the group consisting of the candidate profile based on an analysis of metadata, the candidate profile based on an analysis of sound content, and the candidate profile based on a user interaction with an audio player, the interaction corresponding to at least a portion of audio data.

10. The method of claim 1, wherein the step of analyzing at least a portion of audio data further comprises analyzing sound content, wherein the step of selecting a sound profile based upon the analysis of the audio data further comprises selecting from factory set sound profiles, wherein the step of selecting a sound profile based upon the analysis of the audio data further comprises selecting from user created sound profiles, wherein the step of selecting a sound profile based upon the analysis of the audio data further comprises selecting a sound profile based on an analysis of metadata, wherein the step of selecting a sound profile based upon the analysis of the audio data further comprises selecting a sound profile based on an analysis of sound content, wherein the step of selecting a sound profile based upon the analysis of the audio data further comprises:

selecting a candidate profile based on an analysis of metadata;

selecting a candidate profile based on an analysis of sound content; and selecting a best match profile from the group consisting of the candidate profile based on an analysis of metadata and the candidate profile based on an analysis of sound content, and wherein the step of selecting a sound profile based upon the analysis of the audio data further comprises:

selecting a candidate profile based on an analysis of metadata;

selecting a candidate profile based on an analysis of sound content;

selecting a candidate profile based on a user interaction with an audio player, the interaction corresponding to at least a portion of audio data; and selecting a best match profile from the group consisting of the candidate profile based on an analysis of metadata, the candidate profile based on an analysis of sound content, and the candidate profile based on a user interaction with an audio player, the interaction corresponding to at least a portion of audio data.

11. A method of data analysis by way of an audio player device, comprising:

providing an audio player device, the audio player device providing step comprising:

providing an input interface;

providing a display operatively coupled with the input interface;

providing a decoder operatively coupled with the input interface and the display;

providing an audio output operatively coupled with the decoder;

providing a memory;

providing a smart sound program;

providing an audio analysis circuit operatively coupled with the memory and adapted to determine at least one characterizable element relating to at least one of at least one portion of audio data stored in the memory, the audio analysis circuit being adapted to analyze the at least one portion of audio data using a twelve-tone analysis by way of the smart sound program, the twelve-tone analysis providing information comprising at least one feature selected from a group consisting essentially of a key, a chord, a chord progression, a beat, a structure, and a rhythm, and the information providing extractable data comprising a tempo and a dispersion;

providing a profile selection circuit operatively coupled with the memory and adapted to select a sound profile corresponding to the at least one characterizable element of the at least one portion of audio data stored in the memory and based on previous user interaction, the profile selection circuit using the extractable data; and providing a sound field circuit operatively coupled with the memory and adapted to automatically adjust a sound field setting according to the sound profile, whereby an adjusted sound field setting is provided, wherein the sound field setting comprises at least one parameter selected from a group consisting essentially of an equalizer setting, a mode setting, a treble setting, a bass setting, the mode setting indicating a sound forum type, and wherein a sound field setup comprises an aggregate of the at least one sound field setting parameter, and wherein the audio analysis circuit, the sound field circuit, and the profile selection circuit each comprise at least one element selected from a group consisting essentially of hardware, firmware, and software for implementing a set of executable instructions, recording user interaction with the audio player device, the interaction corresponding to at least one portion of audio data;

analyzing the at least one portion of audio data by the audio analysis circuit using a twelve-tone analysis, the twelve-tone analysis comprising processing the at least one portion of the audio data from a low tone to a high tone, wherein the step of analyzing at least a portion of audio data comprises analyzing metadata, the metadata comprising a time period and at least one characteristic selected from a group consisting essentially of an artist name, an album, a title, a length, and a genre;

selecting a sound profile, based upon the user interaction and the information, by the sound profile circuit;

providing a sound field setting by the sound field circuit;

automatically adjusting a sound field setting according to the sound profile by the sound field circuit, thereby providing an adjusted sound field setting; and outputting at least a portion of the audio data according to the adjusted sound field setting by the audio output.

12. The method of claim 11 wherein the user interaction comprises playing an audio track at a particular sound field setting.

13. The method of claim 11 wherein the user interaction comprises programming a sound profile.

14. The method of claim 13 wherein programming the sound profile comprises responding to prompted questions from the audio player by interfacing with the audio player.

15. The method of claim 11 wherein the step of selecting a sound profile based upon the user interaction further comprises selecting from factory set sound profiles.

16. The method of claim 11 wherein the step of selecting a sound profile based upon the user interaction further comprises selecting from user created sound profiles.

17. The method of claim 11, wherein the user interaction comprises playing an audio track at a particular sound field setting, wherein the user interaction comprises programming a sound profile, wherein programming the sound profile comprises responding to prompted questions from the audio player by interfacing with the audio player, wherein the step of selecting a sound profile based upon the user interaction further comprises selecting from factory set sound profiles, and wherein the step of selecting a sound profile based upon the user interaction further comprises selecting from user created sound profiles.

18. An audio player device, comprising:

an input interface;

a display operatively coupled with the input interface;

a decoder operatively coupled with the input interface and the display;

an audio output operatively coupled with the decoder;

a memory;

a smart sound program;

an audio analysis circuit operatively coupled with the memory and adapted to determine at least one characterizable element relating to at least one of at least one portion of audio data stored in the memory, the audio analysis circuit being adapted to analyze the at least one portion of audio data using a twelve-tone analysis by way of the smart sound program, the twelve-tone analysis comprising processing the at least one portion of the audio data from a low tone to a high tone, the twelve-tone analysis providing information comprising at least one feature selected from a group consisting essentially of a key, a chord, a chord progression, a beat, a structure, and a rhythm, and the information providing extractable data comprising a tempo and a dispersion, wherein the audio analysis circuit is further adapted to analyze metadata, the metadata comprising a time period and at least one characteristic selected from a group consisting essentially of an artist name, an album, a title, a length, and a genre;

a profile selection circuit operatively coupled with the memory and adapted to select a sound profile corresponding to the at least one characterizable element of the at least one portion of audio data stored in the memory and being based on previous user interaction, the profile selection circuit using the extractable data; and a sound field circuit operatively coupled with the memory and adapted to automatically adjust a sound field setting according to the sound profile, whereby an adjusted sound field setting is provided, wherein the sound field setting comprises at least one parameter selected from a group consisting essentially of an equalizer setting, a mode setting, a treble setting, a bass setting, the mode setting indicating a sound forum type, and wherein a sound field setup comprises an aggregate of the at least one sound field setting parameter, and wherein the audio analysis circuit, the sound field circuit, and the profile selection circuit each comprise at least one element selected from a group consisting essentially of hardware, firmware, and software for implementing a set of executable instructions.

19. The device of claim 18, wherein the extractable data further comprises a feature selected from a group consisting essentially of a speed, a key type, a chord type, a number of notes per unit time, and a rhythm ratio.

20. The device of claim 18 wherein the audio analysis circuit is adapted to analyze sound content.

21. The device of claim 18 wherein the profile selection circuit is adapted to select sound profiles from factory set sound profiles.

22. The device of claim 18 wherein the profile selection circuit is adapted to select sound profiles from user created sound profiles.

23. The device of claim 18 further comprising an input interface adapted to record user interaction with an audio player, the interaction corresponding to at least a portion of audio data.

24. The device of claim 18 further comprising a memory adapted to store audio data corresponding to user interaction with an audio player.

25. The device of claim 18 wherein the profile selection circuit is adapted to select:

a candidate profile based on an analysis of metadata;

a candidate profile based on an analysis of sound content;

a candidate profile based on a user interaction with an audio player, the interaction corresponding to at least a portion of audio data; and a best match profile from the group consisting of the candidate profile based on an analysis of metadata, the candidate profile based on an analysis of sound content, and the candidate profile based on a user interaction with an audio player, the interaction corresponding to at least a portion of audio data.

26. The device of claim 18, further comprising:

an input interface adapted to record user interaction with an audio player, the interaction corresponding to at least a portion of audio data; and a memory adapted to store audio data corresponding to user interaction with an audio player, wherein the audio analysis circuit is adapted to analyze sound content, wherein the profile selection circuit is adapted to select sound profiles from factory set sound profiles, wherein the profile selection circuit is adapted to select sound profiles from user created sound profiles, wherein the profile selection circuit is adapted to select:

a candidate profile based on an analysis of metadata;

a candidate profile based on an analysis of sound content;

a candidate profile based on a user interaction with an audio player, the interaction corresponding to at least a portion of audio data; and a best match profile from the group consisting of the candidate profile based on an analysis of metadata, the candidate profile based on an analysis of sound content, and the candidate profile based on a user interaction with an audio player, the interaction corresponding to at least a portion of audio data.

27. The device of claim 18, further comprising an element selected from a group consisting essentially of an MP3 player, a CD player, a DVD audio player, a computer, and any other type of audio player.

28. The device of claim 18, wherein the audio output comprises an element selected from a group consisting essentially of a speaker and an audio jack for use with a headphone set.

29. The device of claim 18, wherein the memory comprises at least one element selected from a group consisting essentially of a built-in hard disk drive, a non-volatile flash memory, a removable memory, a CD, a DVD, and wherein the memory comprises at least one portion having at least one form selected from a group consisting essentially of a removable block, a module, and a chip.

30. The device of claim 18, wherein the memory comprises at least one memory device.

31. The device of claim 18, wherein the input interface comprises an element selected from a group consisting essentially of a keypad, a touch pad, a touch screen, a mouse, and any other type of device that can interact with an electronic device.

32. The device of claim 18, wherein the audio analysis circuit, the sound field circuit, and the profile selection circuit each further comprise a configuration selected from a group consisting essentially of a fixed-purpose circuit, a partially programmable platform, and a wholly programmable platform.

* * * * *